US009007127B2

(12) United States Patent
Tajalli

(10) Patent No.: US 9,007,127 B2
(45) Date of Patent: Apr. 14, 2015

(54) ELECTRONIC CIRCUIT WITH UNIT FOR ATTENUATING AT LEAST ONE INPUT SIGNAL OF AN AMPLIFIER IN AN AUTOMATIC GAIN CONTROL LOOP

(71) Applicant: EM Microelectronic-Marin S.A., Marin (CH)

(72) Inventor: Armin Tajalli, Chavannes-pres-Renens (CH)

(73) Assignee: EM Microelectronic-Marin S.A., Marin (CH)

( * ) Notice: Subject to any disclaimer, the term of this patent is extended or adjusted under 35 U.S.C. 154(b) by 0 days.

(21) Appl. No.: 14/058,372

(22) Filed: Oct. 21, 2013

(65) Prior Publication Data

US 2014/0118069 A1 May 1, 2014

(30) Foreign Application Priority Data

Oct. 26, 2012 (EP) ..................................... 12190221

(51) Int. Cl.
*H03G 3/10* (2006.01)
*H03G 3/30* (2006.01)
*H03H 11/24* (2006.01)

(52) U.S. Cl.
CPC ............... *H03G 3/30* (2013.01); *H03G 3/3063* (2013.01); *H03H 11/245* (2013.01)

(58) Field of Classification Search
USPC .................................. 330/284, 254, 260, 261
See application file for complete search history.

(56) References Cited

U.S. PATENT DOCUMENTS

| 4,112,384 | A | * | 9/1978 | Buchberger ................... 330/141 |
| 4,471,311 | A | | 9/1984 | Hirata |
| 4,839,611 | A | | 6/1989 | Kukulinsky |
| 5,138,277 | A | * | 8/1992 | Robinson et al. ............. 330/281 |
| 5,179,353 | A | * | 1/1993 | Miyake ......................... 330/129 |
| 5,699,017 | A | | 12/1997 | Maejima |
| 7,403,071 | B2 | * | 7/2008 | Hollenbeck et al. .......... 330/254 |
| 2009/0201091 | A1 | | 8/2009 | Vice |
| 2010/0291890 | A1 | * | 11/2010 | Lee ................................ 455/205 |

FOREIGN PATENT DOCUMENTS

WO    WO 2011/080536 A1    7/2011

OTHER PUBLICATIONS

European Search Report issued Mar. 19, 2013, in European Patent Application No. 12190221, filed Oct. 26, 2012 (with English Translation).

* cited by examiner

*Primary Examiner* — Henry Choe
(74) *Attorney, Agent, or Firm* — Oblon, McClelland, Maier & Neustadt, L.L.P.

(57) ABSTRACT

The electronic circuit (1) includes, in an automatic gain control loop, an input amplifier (2), an AGC unit connected to the amplifier output to detect the amplitude of an output signal and a unit (10) for attenuating an input signal of the amplifier based on an adaptation signal ($V_{AGC}$) from the AGC unit. The attenuation unit includes a means of comparing the adaptation signal to a reference signal ($V_{REF}$) and for supplying an attenuation current as a function of the difference between the adaptation and reference signals, to a diode-connected PMOS replica transistor (M2), which is connected by a source to a common mode voltage ($V_{CM}$) dependent on the input signal of the amplifier. The replica transistor controls a PMOS shunt transistor (M1) defining a shunt resistance connected to the amplifier input, whose resistive value depends on the attenuation current passing through the replica transistor.

12 Claims, 3 Drawing Sheets

ELECTRONIC CIRCUIT WITH UNIT FOR ATTENUATING AT LEAST ONE INPUT SIGNAL OF AN AMPLIFIER IN AN AUTOMATIC GAIN CONTROL LOOP

This application claims priority from European Patent Application No. 12190221.7 filed Oct. 26, 2012, the entire disclosure of which is incorporated herein by reference.

FIELD OF THE INVENTION

The present invention concerns an electronic circuit provided with a unit for attenuating at least one input signal of an input amplifier in an automatic gain control loop. In addition to the input amplifier, the electronic circuit further comprises an automatic gain control unit, which supplies an adaptation signal to the attenuation unit as a function of the detected amplification level. The attenuation unit is thus capable of attenuating the amplitude of at least one input signal based on the adaptation signal relative to the detected amplitude level at the input amplifier output.

BACKGROUND OF THE INVENTION

Conventionally, an electronic circuit with an automatic gain control loop for an input amplifier can be arranged in a data or control radiofrequency signal receiver or in any other type of data receiver or transmitter. When data signals are received at a determined carrier frequency, these signals are picked up by an antenna and shaped in a conventional shaping stage. The shaped signals are supplied to an input amplifier of the electronic circuit.

Normally, the input amplifier output can be connected to a mixer unit or sometimes directly to a demodulation unit or to an analogue-digital converter. The mixer unit can convert the frequency of the signals picked up by the antenna and amplified by the input amplifier by means of at least one oscillating signal from a local oscillator. The intermediate signal or signals supplied at the mixer unit output may thus be converted to a low frequency, and even directly into base band prior to a data or control signal demodulation operation in a demodulator. In order to be able to demodulate the data from the intermediate signals properly, the amplitude of the signals amplified by the input amplifier must be adapted in the automatic gain control loop of the electronic circuit. The amplitude adaptation also takes account of the fact that the input amplifier must be capable of operating in a linear operating mode.

The amplitude of the signals supplied to the input amplifier may be too large, which generates a significant variation margin in the input signals. In these conditions, the input amplifier, which may be a VGA or LNA amplifier, may become non-linear, which is undesirable for the electronic circuit to be able to operate properly. Thus, a variable shunt resistance may be placed at the inputs of the input amplifier to easily attenuate the amplitude of the input signals. This enables the amplifier to operate in a linear manner. The resistive value of the variable resistance may be controlled in an automatic gain control loop of the electronic circuit, which depends on the amplitude level at the input amplifier output compared to a desired reference amplitude level.

FIG. 1 shows a conventional electronic circuit 1, which is provided with a means of attenuating at least one input signal $V_{IN}$ of an input amplifier 2. In this example of the state of the art, a sinusoidal voltage $V_S$ is shown for supplying at least one input signal $V_{IN}$ through a series resistance $R_S$ to the input amplifier 2. However, it is quite clear that the input signal or signals preferably originate from signals picked up by an antenna which is not shown.

The gain of input amplifier 2, which may be a VGA amplifier, may be adjusted in an automatic gain control loop in two ways. The gain of amplifier 2 may thus be adjusted by changing the actual gain of VGA amplifier 2 and also by adjusting a variable input resistance $R_{IN}$, which may be formed, for example, of one or several CMOS transistors arranged in parallel. Reducing the resistive value of the input resistance also reduces the amplitude of the input signal and thus of the input amplifier gain. In the case of the CMOS transistors used and not shown, the drain and source terminals are connected to the input of input amplifier 2 and the earth terminal. The gate of each transistor is controlled by an adaptation signal in an automatic gain control loop.

The automatic gain control loop is thus formed of input amplifier 2, a peak detector 3, an amplifier-comparator 4 or a transconductance amplifier, a first drive component 6 and a second drive component 7. The output signal $V_{OUT}$ of the input amplifier, which is an alternating signal, generally depends on the carrier frequency of the incoming signals. The output signal is supplied to the conventional peak detector 3 to supply at output a rectified signal $V_P$, which may be continuous, and which represents the amplitude of input signal $V_{IN}$ amplified by input amplifier 2. The rectified signal $V_P$ may be stored in a capacitor $C_P$ of peak detector 3.

Amplifier-comparator 4 is connected to the peak detector to receive rectified signal $V_P$. This amplifier-comparator 4 is arranged to determine an error between the rectified signal $V_P$ representing the amplitude of signals $V_{OUT}$ amplified by input amplifier 2, and a reference signal $V_R$, which is representative of a defined amplitude threshold. The rectified signal and the reference signal are generally a rectified voltage $V_P$ and a reference voltage $V_R$ supplied to the input of amplifier-comparator 4. Rectified voltage $V_P$ is supplied to the positive input, whereas reference voltage $V_R$ is supplied to the negative input of amplifier-comparator 4.

According to the determined error between the two compared voltages, an adaptation signal in the form of an adaptation current or voltage $V_{AGC}$ is supplied by amplifier-comparator 4. An integration capacitor $C_{INT}$ is also arranged at the output of amplifier-comparator 4, if the amplifier-comparator output signal is in the form of a current. Adaptation signal $V_{AGC}$ is supplied to first drive component 6 to adapt the gain of input amplifier 2 immediately, and to second drive component 7 to adapt the shunt resistance $R_{IN}$.

The gain of input amplifier 2 is adapted in two different ways to a stable operating value, until the difference between the rectified voltage $V_P$ and the reference voltage $V_R$ becomes close to zero. However, adapting said shunt resistance $R_{IN}$ to a suitable attenuation value is relatively difficult to achieve in the configuration shown in FIG. 1, which is a drawback.

A second embodiment of this type of state of the art electronic circuit 1 is shown in FIG. 2, which is of similar design to the embodiment described above with reference to FIG. 1. In this case, input amplifier 2, which may be a VGA amplifier, has two inputs. The two inputs are arranged to receive a first input signal $V_{IN+}$ and a second input signal $V_{IN-}$ which has a phase shift of 180° from first input signal $V_{IN+}$. These input signals generally originate from signals picked up by an antenna and shaped in a conventional shaping stage.

The automatic control loop further includes an input amplifier 2, an automatic gain control unit 5, which may be formed of a peak detector and an amplifier-comparator as explained with reference to FIG. 1. The AGC unit supplies an adaptation signal $V_{AGC}$ to a first drive component 6, to immediately adapt the gain of input amplifier 2, and to a second drive component 7, to adapt shunt resistance $R_{IN}$. In the example, this shunt resistance $R_{IN}$ is at least one MOS transistor, for example a PMOS transistor, whose drain is connected to the first input $V_{IN+}$ and whose source is connected to the second input $V_{IN-}$, and whose gate is controlled by the second drive component 7. Generally, it is difficult to adapt shunt resistance $R_{IN}$ smoothly, which can constitute a drawback of this type of input attenuation of the input amplifier. If the source resistance is Rs, the signal must be attenuated by factor $R_{IN}/(R_{IN}+Rs)$.

Finally, a third embodiment of this type of state of the art electronic circuit 1 is shown in FIG. 3 with adjustment of the variable input resistance equivalent to a digital command which is a function of various reference voltage levels. Electronic circuit 1 includes an automatic gain control loop, whose principle is similar to that described with reference to FIGS. 1 and 2. The automatic gain control loop also includes input amplifier 2 with two inputs $V_{IN+}$ and $V_{IN-}$, and automatic gain control unit 5, which may be formed of a peak detector and an amplifier-comparator, as explained with reference to FIG. 1. The AGC unit supplies an adaptation voltage $V_{AGC}$, which is compared to several reference levels $V_{REF1}$, $V_{REF2}$, $V_{REFN}$ in several hysteresis comparators 11, 12, 13. Several parallel shunt resistors $R_{IN1}$, $R_{IN2}$, $R_{INN}$, which are each formed by a PMOS transistor, are connected via their drain and source, to the two inputs $V_{IN+}$ and $V_{IN-}$. These shunt resistances are each controlled by a corresponding comparator.

A digital command may thus be applied as a function of the N reference voltage levels $V_{REF1}$, $V_{REF2}$, $V_{REFN}$ to control the conduction or non-conduction of the N resistors as a function of the level of voltage $V_{AGC}$. Thus, the input impedance achieved by placing the shunt resistances in parallel attenuates the input signals of input amplifier 2 over a very broad range. This allows much finer adjustment of the amplifier gain, compared to the use of a single comparator and a single PMOS transistor as shunt resistance. However, the input signal attenuation and thus the adaptation of the input amplifier gain are carried out at different voltage levels, which makes the adjustment complicated to perform. Moreover, this arrangement of comparators may not be suitable in all desired adaptation situations, which is a drawback.

US Patent Application No. 2009/0201091 A1 describes a controller circuit having an attenuator. This attenuator is connected to a polarisation circuit. The attenuator includes a shunt FET transistor, whose the source is connected to earth and the drain is connected to a node of a resistive path of the attenuator. The gate of the shunt transistor is connected to a gate and drain of a FET transistor of the polarisation circuit, whose the source is connected to earth. The arrangement of shunt transistor of polarisation circuit and the shunt transistor of the attenuator forms a current mirror. However nothing is provided for supplying a smooth attenuation in an input signal of an amplifier in an automatic gain control loop.

U.S. Pat. No. 4,839,611 describes an electronic circuit with an attenuator in input of an amplifier. The attenuator is controlled by an automatic gain control unit, which is connected between the amplifier output and a control input of the attenuator. The automatic gain control unit supplies a control voltage to the attenuator according to an output voltage of the amplifier to adjust proportionally the input voltage of the amplifier. The attenuator is mainly a passive attenuator continuously variable with a resistive element on a path of an input signal of the amplifier. However nothing is provided for supplying a smooth attenuation of an input signal of an amplifier in an automatic gain control loop as a function of a comparison between an amplifier output level and a reference signal.

WO Patent Application No. 2011/080536 A1 describes an arrangement of transistors, which can be controlled by a control voltage in order to adapt the resistive value of an input resistance for example the input resistance of an amplifier. However nothing is described on the manner to supply a smooth attenuation to the amplifier input as a function of an amplifier output level.

SUMMARY OF THE INVENTION

It is therefore an object of the invention to overcome the drawbacks of the aforementioned state of the art by providing an electronic circuit provided with a unit for attenuating at least one input signal of an input amplifier, which smoothly attenuates the input signal or signals, and which is easy to implement while increasing the reliability of the electronic circuit.

The invention therefore concerns an electronic circuit including, in an automatic gain control loop, an input amplifier, an automatic gain control unit connected to the output of the input amplifier to detect an amplitude level of an output signal of the input amplifier, and a unit for attenuating at least one input signal of the input amplifier based on an adaptation signal supplied by the automatic gain control unit, wherein the attenuation unit includes a means of comparison for comparing the adaptation signal to a reference signal and for supplying an attenuation current, whose intensity is a function of the difference between the adaptation signal and the reference signal, to a diode-connected replica transistor having a first conductivity type, which is connected by a source or an emitter to a common mode voltage dependent on the input signal of the input amplifier, the diode-connected replica transistor controlling a shunt transistor having a first conductivity type, which defines a shunt resistance connected to the input amplifier input, whose resistive value depends on the intensity of the attenuation current passing through the diode-connected replica transistor.

Specific embodiments of the electronic circuit provided with a unit for attenuating at least one input signal of an input amplifier are defined in the dependent claims 2 to 12.

One advantage of the electronic circuit provided with a unit for attenuating at least one input signal of an input amplifier lies in the fact that attenuation of the input signal or signals is carried out with a smoother transition around the expected amplitude value of the input signals. To achieve this, the attenuation unit comprises a means of comparing currents or voltages. The current or voltage comparison means provides an attenuation current to a replica transistor as a function of the difference between an adaptation current and a reference current or between an adaptation voltage and a reference voltage. The adaptation current or adaptation voltage is supplied by an automatic gain control unit based on the detected amplitude level of the output signal of the input amplifier. The replica transistor is arranged in parallel with a shunt transistor forming a shunt resistance connected to one or to two inputs of the input amplifier. The amplitude of the input signal or signals is thus continuously attenuated in a dynamic manner by the arrangement of the replica transistor connected to the shunt transistor.

BRIEF DESCRIPTION OF THE DRAWINGS

The objects, advantages and features of the electronic circuit provided with a unit for attenuating at least one input signal of an input amplifier will appear more clearly in the following description, based on non-limiting embodiments illustrated by the drawings, in which.

DETAILED DESCRIPTION OF THE INVENTION

In the following description, all those electronic components of the electronic circuit, which is provided with a unit for attenuating at least one input signal of an input amplifier in an automatic gain control loop, which are well known to those skilled in the art in this technical field, will only be described in a simplified manner.

Figure 4:
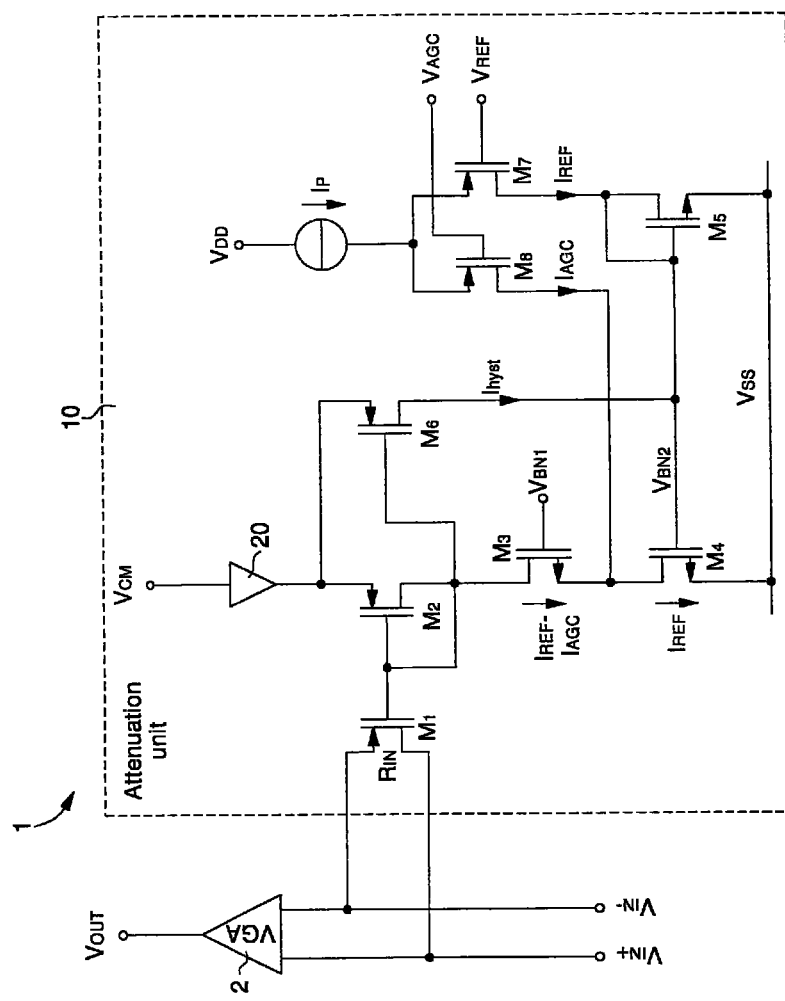
FIG. 4 shows an embodiment of an electronic circuit provided with a unit for attenuating at least one input signal of an input amplifier in an automatic gain control loop according to the invention.

FIG. 4 shows an embodiment of electronic circuit 1, which is provided in particular with an attenuation unit 10 for input signals $V_{IN+}$ and $V_{IN-}$ of an input amplifier 2. These two set frequency input signals, which may be 180° phase shifted relative to each other, are provided to two inputs of input amplifier 2, which may be a VGA or LNA amplifier. These two signals $V_{IN+}$ and $V_{IN-}$ may originate from signals picked up by an antenna and shaped in a shaping stage before the input amplifier. However, the input amplifier 2 may also only receive a single input signal with attenuation unit 10 arranged to attenuate the amplitude of this single input signal.

In addition to input amplifier 2, in an automatic gain control loop electronic circuit 1 further includes an automatic gain control unit which is not shown in FIG. 4. This automatic gain control unit is directly connected to the output of input amplifier 2 and is capable of determining the amplitude of output signal $V_{OUT}$ of input amplifier 2. Based on the detected amplitude, a signal $V_{AGC}$ is supplied to input signal attenuation unit 10, but it may also be supplied to the input amplifier in a specific embodiment. The gain of input amplifier 2 can thus be conventionally adapted by immediate gain adaptation in the input amplifier, but also, and according to the invention, by attenuation unit 10 for at least one input signal.

A peak detector may be used in the automatic gain control unit to detect the amplitude level of the output signal $V_{OUT}$ of input amplifier 2. The AGC unit may also include an amplifier-comparator for comparing the rectified signal from the peak detector to a reference signal which is a function of the desired output signal amplitude. This allows the AGC unit to supply adaptation signal $V_{AGC}$ for attenuation unit 10.

Adaptation signal $V_{AGC}$ may be an adaptation voltage $V_{AGC}$, or also an adaptation current in an embodiment which is not shown but is also explained below. The level of adaptation voltage $V_{AGC}$ is directly dependent on the amplitude level $V_{OUT}$ of the output signal of input amplifier 2. If the amplitude of output signal $V_{OUT}$ is above a determined reference threshold, the effect of the adaptation voltage is to command attenuation unit 10 to attenuate to a greater or lesser extent the amplitude of the input signal or signals $V_{IN+}$ and $V_{IN-}$ of input amplifier 2. However, in the opposite case, where the amplitude of output signal $V_{OUT}$ is below the determined reference threshold, only slight attenuation or no attenuation is performed as explained below. In that case, only a high value shunt resistance remains at the output of attenuation unit 10, which connects the two inputs of input amplifier 2 or one input and one terminal of a voltage supply terminal (not shown).

As shown in FIG. 4, attenuation unit 10 includes a means of comparison for comparing a reference signal $V_{REF}$ and an adaptation signal $V_{AGC}$. The output of the comparison means controls an attenuation current. The intensity of the attenuation current is set between a minimum value, which may be 0 A, and a maximum value, which may be determined by a first current, such as a reference current $I_{REF}$, pre-set via a polarisation current source $I_P$.

The attenuation current is arranged to be provided to a replica transistor M2, which is diode-connected and has a first type of conductivity, and which controls, via a control electrode, a shunt transistor M1, which has a first type of conductivity. The current electrodes of this shunt transistor M1 are respectively connected to at least one input and one terminal of a voltage supply source, and preferably to two inputs of the input amplifier 2. Depending on the current value passing through replica transistor M2, shunt resistance $R_{IN}$ set by transistor M1 varies between a minimum resistive value and a maximum resistive value.

Generally, the minimum current value is representative of the fact that the amplitude of output signal $V_{OUT}$ of input amplifier 2 is below a predetermined reference threshold, in the automatic gain control unit. In these conditions, attenuation unit 10 is arranged not to operate shunt transistor M1 so that the shunt resistance is at a maximum value $R_{MAX}$. Conversely, the maximum current value is representative of the fact that the amplitude of output signal $V_{OUT}$ of input amplifier 2 is theoretically well below the predetermined reference threshold. In these conditions, attenuation unit 10 is arranged to operate shunt transistor M1 so that the shunt resistance is at a minimum value $R_{MIN}$.

Of course, dynamic adaptation of the resistive value of shunt resistance $R_{IN}$ can be carried out smoothly owing to the smooth current variation through replica transistor M2. One of the current electrodes of this transistor M2, which is the drain or collector electrode, is connected to the control electrode, which is the gate or base electrode. The other current electrode of transistor M2, which is the source or emitter electrode, is connected via a voltage buffer cell 20 to a common mode voltage $V_{CM}$, which is also the common mode voltage of the alternating input signal or alternating input signals $V_{IN+}$ and $V_{IN-}$. This common mode voltage $V_{CM}$ is a mean voltage DC of the input signal or signals. Consequently, the two transistors M1 and M2, which are two transistors of identical size, may form a current mirror, with replica transistor M2, which controls shunt transistor M1.

It should be noted that it is important for voltage $V_{CM}$ to be applied to the source or emitter of replica transistor M2, given that the replica transistor is very similar to shunt transistor M1. Generally, the common mode voltage $V_{CM}$ may be equal to the high voltage $V_{DD}$ of the supply voltage source. Thus, it is very easy to connect the source of the replica transistor M2 directly to the high voltage $V_{DD}$, which allows the voltage buffer cell 20 to be removed.

Preferably, the two transistors M1 and M2 are PMOS transistors in this embodiment wherein the source of replica transistor M2 is connected to voltage buffer cell 20 and the source of shunt transistor M1 is connected to a first input of input amplifier 2. The drain of shunt transistor M1 is connected either to one of the terminals of the supply voltage source for an input amplifier with a single input, or to a second input of input amplifier 2.

The means of comparing reference signal $V_{REF}$ and adaptation signal $V_{AGC}$ of attenuation unit 10 will now be described in detail. Preferably, the comparison means in this embodiment compares a reference voltage $V_{REF}$ to an adaptation voltage $V_{AGC}$ supplied by the automatic gain control unit. Reference voltage $V_{REF}$ may be set at a value close to that relating to the amplitude reference threshold of the automatic gain control unit. The lower the adaptation voltage $V_{AGC}$ is, i.e. below reference voltage $V_{REF}$, the lower the amplitude of output signal $V_{OUT}$ of input amplifier 2 will be. However, when adaptation voltage $V_{AGC}$ is equal to or higher than reference voltage $V_{REF}$, the amplitude of output signal $V_{OUT}$ of input amplifier 2 is too great. This amplitude of output signal $V_{OUT}$ must theoretically be attenuated by adapting shunt resistance $R_{IN}$ at the input of input amplifier 2.

As shown in FIG. 4, the means of comparison includes a pair of input transistors M7 and M8 having a first type of conductivity, like transistors M1 and M2. The sources or emitters of input transistors M7 and M8 are connected to a polarisation current source $I_P$, which is connected to a first terminal of a voltage supply source, which may be the high potential terminal $V_{DD}$. The gate or base of the first input transistor M7 is arranged to receive reference voltage $V_{REF}$, whereas the gate or base of the second input transistor M8 is arranged to receive adaptation voltage $V_{AGC}$. Preferably, in this embodiment, these input transistors M7 and M8 are PMOS transistors of identical dimension.

The drain of the first PMOS input transistor M7 is connected to a first diode-connected transistor M5 having a second type of conductivity of a current mirror, which is preferably an NMOS transistor. The source of this diode-connected transistor M5 is connected to a second terminal of the supply voltage source, which may be the low potential terminal $V_{SS}$. A second NMOS transistor M4 of the current mirror is connected via its gate to the gate of the first diode-connected transistor M5. The source of the second NMOS transistor M4 is connected to the low potential terminal $V_{SS}$ of the supply voltage source, whereas its drain is arranged to draw a current corresponding to the first current $I_{REF}$ passing through the first diode-connected transistor M5. The drain of the second transistor M4 is connected to the drain of the second PMOS input transistor M8, and also to the source or emitter of an output transistor M3 of the comparison means having a second type of conductivity. This output transistor M3 is preferably an NMOS transistor.

The gate of output transistor M3 is controlled by a determined polarisation voltage $V_{BN1}$, whereas the gates of the first and second transistors M4 and M5 of the current mirror are at an operating voltage $V_{BN2}$ determined as a function of the current passing through the diode-connected transistor M5. The drain of output transistor M3 is connected to the gate and to the drain of diode-connected replica transistor M2 to supply thereto the output attenuation current from the comparison means based on the comparison between the adaptation voltage $V_{AGC}$ and the reference voltage $V_{REF}$.

When output signal $V_{OUT}$ of input amplifier 2 is at a level below the reference threshold determined in the automatic gain control unit, the adaptation voltage $V_{AGC}$ supplied to attenuation unit 10 is also below the reference voltage $V_{REF}$. The polarisation current $I_P$ mainly passes through the second input transistor M8 to generate the second current, which is an adaptation current $I_{AGC}$. The first current, which is a reference current $I_{REF}$ through the first input transistor M7, is thus equal to the current $(I_P - I_{AGC})$. This second adaptation current $I_{AGC}$ is supplied to the drain of the second transistor M4 of the current mirror.

Since in this case, the second current $I_{AGC}$ is greater than the first current $I_{REF}$, the resulting current is less than 0 A. Consequently, no attenuation current passes through the output transistor M3, and replica transistor M2. Transistor M3 thus acts as a buffer transistor, to perform the subtraction between first current $I_{REF}$ and second current $I_{AGC}$. The resistance $R_{IN}$ defined by shunt transistor M1 is thus at a maximum resistive value $R_{MAX}$.

For an adaptation voltage $V_{AGC}$ supplied to attenuation unit 10 equal to reference voltage $V_{REF}$, polarisation current $I_P$ is distributed substantially equally in each input transistor M7 and M8. The first current, which is the reference current $I_{REF}$, is substantially equal to the second current, which is the adaptation current $I_{AGC}$. The resulting attenuation current through output transistor M3 is close to 0 A, which does not affect the resistive value of resistance $R_{IN}$ defined by shunt transistor M1. However, from the instant when adaptation voltage $V_{AGC}$ is higher than reference voltage $V_{REF}$, polarisation current $I_P$ passes mainly through the first input transistor M7. Thus the resulting attenuation current through output transistor M3 and replica transistor M2 is higher than 0 A, which consequently reduces shunt resistance $R_{IN}$ defined by shunt transistor M1 to a minimum value $R_{MIN}$. The resulting attenuation current $I_{REF} - I_{AGC}$ is at a maximum value equal to $I_P$, when adaptation voltage $V_{AGC}$ is higher than 50 to 100 mV relative to reference voltage $V_{REF}$.

Figure 5:
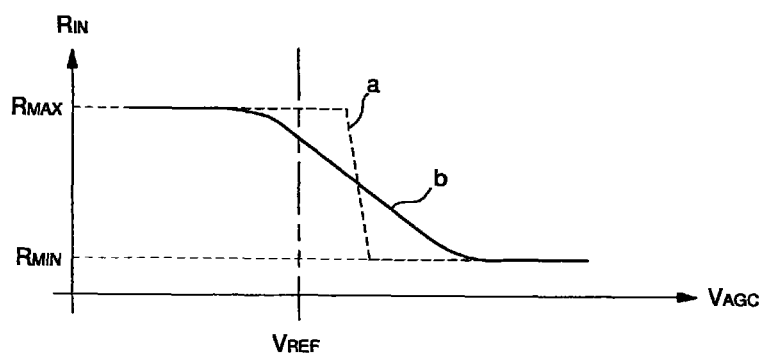
FIG. 5 shows a graph of the resistive value of the shunt resistance for attenuating at least one input signal with respect to the adaptation signal supplied by the automatic gain control unit of the electronic circuit according to the invention.

Since the gain adaptation of input amplifier 2 is carried out smoothly around the expected amplitude of output signal $V_{OUT}$, the transition between a maximum resistive value and a minimum resistive value of shunt resistance $R_{IN}$ is also carried out smoothly by attenuation unit 10. FIG. 5 shows this transition between a maximum resistive value $R_{MAX}$ and a minimum resistive value $R_{MIN}$, or vice versa in curve b for an adaptation voltage $V_{AGC}$ relative to a reference voltage $V_{REF}$ in an attenuation unit of the present invention.

Figure 1:
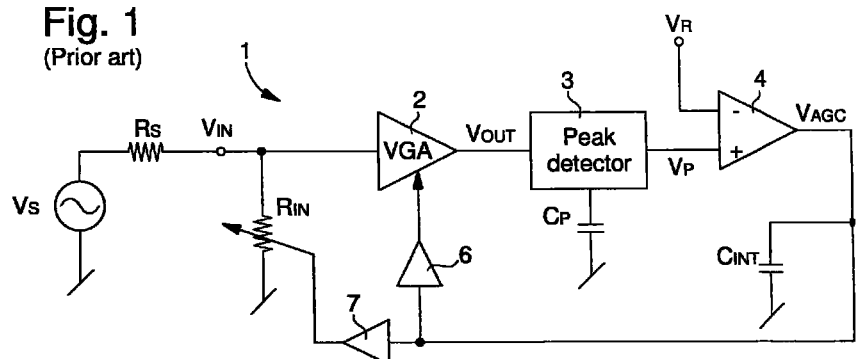
FIG. 1, referred to above, shows a first example of an electronic circuit having a means of attenuating at least one input signal of an input amplifier in a state of the art automatic gain control loop, FIG. 2, referred to above, shows a second example of electronic circuit having a means of attenuating input signals of an input amplifier in a state of the art automatic gain control loop, FIG. 3, referred to above, shows a third example of electronic circuit having a means of attenuating input amplifier input signals in a state of the art automatic gain control loop.
Figure 2:
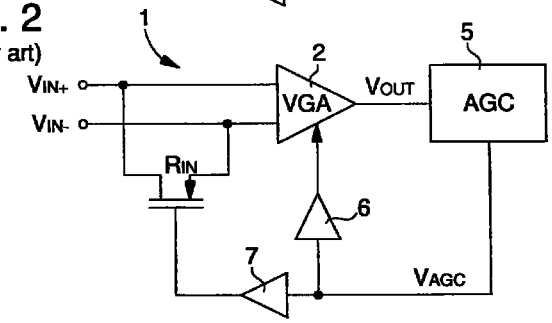
Figure 3:
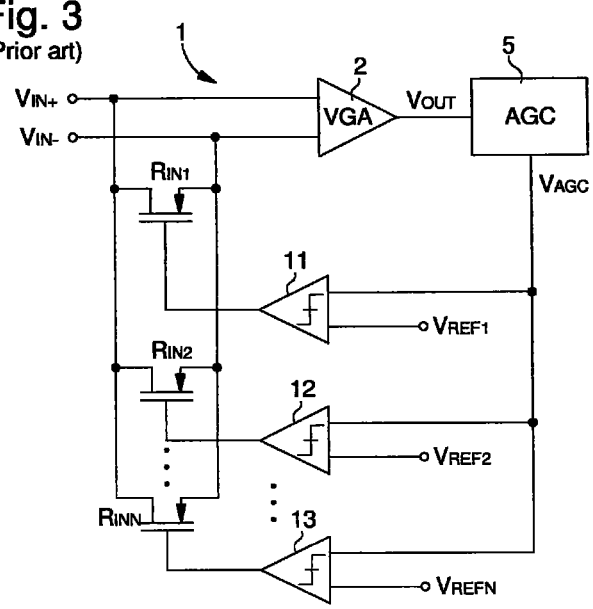

Conversely, FIG. 5 also shows curve a relative to a digital controlled adaptation of shunt resistance $R_{IN}$ as shown in FIG. 3 with a state of the art single comparator. In this curve a, the transition between resistive value $R_{MAX}$ and minimum resistive value $R_{MIN}$, or vice versa, is performed relatively abruptly. This does not allow the input amplifier input signals to be attenuated smoothly and there is no dynamic adaptation carried out as a function of the output signal $V_{OUT}$ amplitude level of the input amplifier.

In order to be able to increase the resistivity of the circuit relative to noise, it is possible to provide another hysteresis path for the comparison means. To achieve this, a hysteresis transistor M6 having the first type of conductivity, is connected in parallel to replica transistor M2. This hysteresis transistor M6 is preferably a PMOS transistor, whose source is connected to the source of replica transistor M2 for connection to the common mode voltage $V_{CM}$ through the voltage buffer cell 20. The gate of hysteresis transistor M6 is connected to the gate and to the drain of replica transistor M2, whereas the drain of hysteresis transistor M6 is connected to the gate and to the drain of the first diode-connected transistor M5 of the current mirror. The assembly formed by shunt transistor M1, replica transistor M2 and hysteresis transistor M6 also forms a current mirror, wherein the current in each transistor can be controlled by the diode-connected replica transistor M2.

At the moment when adaptation voltage $V_{AGC}$ is equal to reference voltage $V_{REF}$, the first current is equal to the second current, which means that output transistor M3 does not supply any attenuation current yet to the diode-connected replica transistor M2. The current mirrored in hysteresis transistor M6 is thus also equal to 0 A. When adaptation voltage $V_{AGC}$ becomes higher than reference voltage $V_{REF}$, the first current $I_{REF}$ becomes greater than second current $I_{AGC}$. Output transistor M3 supplies the attenuation current corresponding to $I_{REF}-I_{AGC}$ without yet taking account of hysteresis transistor M6. This attenuation current is mirrored in hysteresis transistor M6. Thus, the first diode-connected transistor M5 receives the first current $I_{REF}$ and hysteresis current $I_{hyst}$ from transistor M6. The attenuation current in this case becomes $(I_{REF}+I_{hyst})-I_{AGC}$. In order for the current to be equal to 0 A, this means that an adaptation voltage $V_{AGC}$ corresponding to the reference voltage $V_{REF}$ must be applied, added to a voltage swing $\Delta V$. A hysteresis effect is thus obtained simply by connecting PMOS hysteresis transistor M6 for a dynamic resistive variation of shunt resistance $R_{IN}$ to adapt the input amplifier gain.

Figure 6:
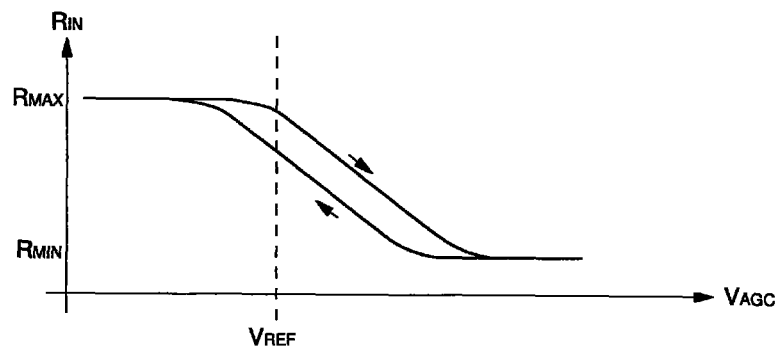
FIG. 6 shows a graph of the resistive value of the shunt resistance for attenuating at least one input signal with respect to the adaptation signal supplied by the automatic gain control unit of the electronic circuit according to the invention taking account of hysteresis in the attenuation unit.

The effect of the hysteresis path can be seen in FIG. 6, which shows a curve of the resistive value of the shunt resistance relative to the variation in adaptation voltage. When adaptation voltage $V_{AGC}$ increases from an initial value, at which the attenuation current is equal to 0 A, the resistive value of the shunt resistance varies from a maximum value $R_{MAX}$ to a minimum value $R_{MIN}$ on the curve furthest to the right in FIG. 6. However, when adaptation voltage $V_{AGC}$ decreases with a resistive value of the attenuation resistance from a minimum value $R_{MIN}$ to a maximum value $R_{MAX}$, the resistance variation follows the curve furthest to the left. This is due to the variation in the hysteresis current added to the first current in the first diode-connected transistor of the current mirror.

By way of non-limiting example of the embodiment shown in FIG. 4, the supply voltage of electronic circuit 1 may be set between 1.2 V and 3.6 V and of course relies on semiconductor technology. This technology may be bipolar technology or preferably CMOS technology for example. Depending on the technology used, the supply voltage may even have a value of around 0.8 V. According to the established polarisation current $I_P$, normally the first current and the second current can vary up to a maximum value of around 100 nA, but it is possible to have a variation up to a value of 1 µA depending on the technology used. Reference voltage $V_{REF}$ may be set at 0.7 V, while adaptation voltage $V_{AGC}$ may vary around 0.7 V. Gate voltage $V_{BN1}$ of output transistor M3 may be set at 0.9 V, while the gate voltage of the current mirror is close to 0.7 V. The minimum resistive value $R_{MIN}$ of the shunt resistance defined by the shunt transistor M1 may be around 100 kOhms, while the maximum resistive value $R_{MAX}$ of the shunt resistance, when the shunt transistor M1 is non conductive, may be around 1 to 10 MOhms. The common mode voltage $V_{CM}$ may be around 1.2 V for example.

According to a variant embodiment of the electronic circuit, a current comparison may be carried out by the comparison means of attenuation unit 10. For this current comparison, the structure described with reference to FIG. 4 may be used again. However, the polarisation current source $I_P$ and the first and second input transistors M7 and M8 are no longer used. There remains only one reference current source $I_{REF}$, which supplies a continuous fixed reference current $I_{REF}$ to the first diode-connected transistor M5 of the current mirror. For this current comparison, the automatic control unit is arranged to supply an adaptation current $I_{AGC}$ which varies inversely to the amplitude of output signal $V_{OUT}$ of input amplifier 2. This means that the greater the amplitude of output signal $V_{OUT}$ is, the weaker the current $I_{AGC}$ will be, and conversely, the smaller the amplitude of output signal $V_{OUT}$ is, the stronger the current $I_{AGC}$ will be. Thus, when the amplitude of output signal $V_{OUT}$ is above a defined amplitude reference threshold in the automatic gain control unit, adaptation current $I_{AGC}$ must be smaller than the reference current $I_{REF}$. This means that the shunt resistance $R_{IN}$ can be adapted to a low resistive value so as to decrease the input amplifier gain accordingly.

The hysteresis path may also be used for the current comparison means, as described with reference to FIG. 4. The hysteresis current supplied by PMOS hysteresis transistor M6 is added to the reference current in the diode-connected NMOS transistor M5. A substantially equivalent variation curve of adaptation current $I_{AGC}$ relative to the resistive value of the shunt resistance may be illustrated as in FIG. 6 described above.

It should also be noted that electronic circuit 1 with attenuation unit 10 shown in FIG. 4 may be made with an inverted structure, by replacing each PMOS transistor with an NMOS transistor, defined as having a first type of conductivity. Moreover, each NMOS transistor of FIG. 4 is replaced with a PMOS transistor defined as having a second type of conductivity. However the current mirror formed of PMOS transistors M4 and M5 in this new embodiment is connected to the high potential terminal $V_{DD}$ of the supply voltage source, whereas polarisation current source $I_P$ is connected to the low potential terminal $V_{SS}$ of the supply voltage source. The sources of NMOS replica transistor M2 and NMOS hysteresis transistor M6 are connected to the common mode voltage $V_{CM}$. The NMOS shunt transistor is connected via its gate to the gate of replica transistor M2 and to one or two inputs of input amplifier 2.

It is important that transistors M1, M2 and M6 are connected to the same common mode voltage $V_{CM}$ by their source so as to properly replicate the attenuation current of replica transistor M2 in the other two transistors M1 and M6. A shunt resistance variation is performed smoothly to adapt the gain of input amplifier 2. In this embodiment, it is possible to have a common mode voltage close to 0 V, which was not necessarily the case for the embodiment described with reference to FIG. 4.

Of course, for a current comparison version in the attenuation unit which is the reverse of that described above, all the NMOS transistors shown in FIG. 4 may also be replaced by PMOS transistors. All the other PMOS transistors of FIG. 4 must also be replaced by NMOS transistors. The same connection to the terminals of the voltage supply source must be carried out as explained in the aforementioned variant embodiment.

The attenuation unit of the electronic circuit may also be formed by bipolar transistors with the same arrangement as shown in FIG. 4. However, for shunt transistor M1 with replica transistor M2, it is much easier to use MOS transistors to properly control the shunt resistance at the input amplifier input, and to control any variation in supply voltage, temperature or in the method of manufacturing the electronic circuit.

From the description that has just been given, several variants of the electronic circuit provided with a unit for attenuating at least one input signal of an input amplifier in an automatic gain control loop can be devised by those skilled in the art without departing from the scope of the invention defined by the claims. It is possible to envisage connecting at least two attenuation units to attenuate one or two input signals of the input amplifier. Each of the attenuation units is arranged with a reference signal for comparison with the adaptation signal which is slightly different from each other in order to adapt the total shunt resistance. Resistances may be added in series in the current mirror to linearise the attenuation current. The LNA or VGA input amplifier may be capable of amplifying FSK or PSK radio frequency signals picked up by an antenna. There may also be an input amplifier arranged after a signal mixer to amplify the converted frequency intermediate signals.

What is claimed is:

1. An electronic circuit including, in an automatic gain control loop, an input amplifier, an automatic gain control unit connected to the output of the input amplifier to detect an amplitude level of an output signal of the input amplifier, and a unit for attenuating at least one input signal of the input amplifier based on an adaptation signal supplied by the automatic gain control unit,
wherein the attenuation unit includes a means of comparison for comparing the adaptation signal to a reference signal and for supplying an attenuation current, whose intensity is a function of the difference between the adaptation signal and the reference signal, to a diode-connected replica transistor having a first conductivity type, which is connected by a source or an emitter to a common mode voltage dependent on the input signal of the input amplifier, the diode-connected replica transistor controlling a shunt transistor having a first conductivity type, which defines a shunt resistance connected to the input amplifier input, whose resistive value depends on the intensity of the attenuation current passing through the diode-connected replica transistor.

2. The electronic circuit according to claim 1, wherein the input amplifier includes an input for receiving an alternating input signal, wherein the shunt transistor is an identical transistor to the replica transistor, wherein a source or an emitter of the shunt transistor is connected to the input of the input amplifier, and wherein a drain or a collector of the shunt transistor is connected to a terminal of a supply voltage source.

3. The electronic circuit according to claim 1, wherein the input amplifier includes two inputs for receiving two input signals at a determined frequency, which are phase shifted by 180° in relation to each other, wherein the shunt transistor is an identical transistor to the replica transistor, wherein a source or an emitter of the shunt transistor is connected to a first input of the input amplifier, and wherein a drain or a collector of the shunt transistor is connected to a second input of the input amplifier.

4. The electronic circuit according to claim 1, wherein the means of comparison is arranged to compare an adaptation signal in the form of an adaptation voltage and a reference signal in the form of a reference voltage, wherein the means of comparison includes a pair of input transistors having a first type of conductivity, each connected via a source or an emitter thereof to a polarisation current source, which is connected to a first terminal of a supply voltage source, a gate or base of the first input transistor receiving the reference voltage, while a gate or base of the second input transistor receives the adaptation voltage, wherein a drain or collector of the first input transistor is connected to a first diode-connected transistor having a second type of conductivity of a current mirror, which includes a second transistor having a second type of conductivity connected via a gate or base thereof to a gate or base of the first diode-connected transistor, sources or emitters of the first and second transistors of the current mirror being connected to a second terminal of the supply voltage source, and wherein a drain or collector of the second transistor of the current mirror is connected to a drain or collector of the second input transistor and arranged to supply the attenuation current to the diode-connected replica transistor.

5. The electronic circuit according to claim 4, wherein the means of comparison includes an output transistor having a second type of conductivity, which is arranged between the drain or collector of the second transistor of the current mirror and a gate or base and a drain or collector of the diode-connected replica transistor, the conduction of the output transistor for supplying the attenuation current being controlled by a polarisation voltage across a gate or base of the output transistor.

6. The electronic circuit according to claim 1, wherein the means of comparison is arranged to compare an adaptation signal in the form of an adaptation current and a reference signal in the form of a reference current, wherein the means of comparison includes a reference current source, which is connected to a first terminal of a supply voltage source, to supply a reference current to a first diode-connected transistor having a second type of conductivity of a current mirror, which includes a second transistor having a second type of conductivity connected via a gate or base thereof to a gate or base of the first diode-connected transistor, sources or emitters of the first and second transistors of the current mirror being connected to a second terminal of the supply voltage source, and wherein a drain or collector of the second transistor of the current mirror is arranged to receive an adaptation current from the automatic gain control unit, and to supply the attenuation current to the diode-connected replica transistor depending on the difference between the reference current and the adaptation current.

7. The electronic circuit according to claim 6, wherein the means of comparison includes an output transistor having a second type of conductivity, which is arranged between the drain or collector of the second transistor of the current mirror and a gate or base and a drain or collector of the diode-connected replica transistor, the conduction of the output transistor for supplying the attenuation current being controlled by a polarisation voltage across a gate or base of the output transistor.

8. The electronic circuit according to claim 4, wherein the shunt transistor, the replica transistor and the first and second input transistors are PMOS transistors, wherein the first and second transistors of the current mirror and the output transistor are NMOS transistors, wherein the polarisation current source is connected to a high potential terminal of the supply voltage source, whereas the first and second transistors of the current mirror are connected to a low potential terminal of the supply voltage source.

9. The electronic circuit according to claim 4, wherein the shunt transistor, the replica transistor and the first and second input transistors are NMOS transistors, wherein the first and second transistors of the current mirror and the output transistor are PMOS transistors, wherein the polarisation current source is connected to a low potential terminal of the supply voltage source, whereas the first and second transistors of the current mirror are connected to a high potential terminal of the supply voltage source.

10. The electronic circuit according to claim 1, wherein the common mode voltage is supplied to a source or emitter of the diode-connected replica transistor via a voltage buffer cell.

11. The electronic circuit according to claim 1, wherein the means of comparison includes a hysteresis transistor having a first type of conductivity, which is connected in parallel to the diode-connected replica transistor, a source or emitter of the hysteresis transistor being connected to a source or emitter of the replica transistor, whereas a gate or base of the hysteresis transistor is connected to a gate or base of the diode-connected replica transistor, and wherein a drain or collector of the hysteresis transistor is connected to a gate or base and to a drain or collector of the first diode-connected transistor of the current mirror.

12. The electronic circuit according to claim 11, wherein the hysteresis transistor is a PMOS or NMOS transistor, like the replica transistor and the shunt transistor.

\* \* \* \* \*